(12) United States Patent
Kim

(10) Patent No.: US 6,198,422 B1
(45) Date of Patent: Mar. 6, 2001

(54) LOW-VOLTAGE ANALOG-TO-DIGITAL CONVERTER

(75) Inventor: Dong Won Kim, Kyongsangbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/296,493

(22) Filed: Apr. 22, 1999

(30) Foreign Application Priority Data

Jul. 7, 1998 (KR) .................................. 98-27327

(51) Int. Cl.[7] .............................. H03M 1/12; H03M 1/36
(52) U.S. Cl. ............................. 341/159; 341/155; 327/63
(58) Field of Search ................................. 341/159, 155; 327/63, 563, 65, 66, 67, 560, 561

(56) References Cited

U.S. PATENT DOCUMENTS 5,589,785   12/1996   Garavan ................................. 327/63

Primary Examiner—Michael Tokar
Assistant Examiner—Jean Bruner Jeanglaude
(74) Attorney, Agent, or Firm—Morgan, Lewis & Bockius LLP

(57) ABSTRACT

A low-voltage A/D converter is provided which improves resolution by applying a sampling block at input terminal of a comparator to 0~Vdd period. The low-voltage A/D converter includes: data input/output terminals consisting of input terminals for respectively inputting a positive reference voltage VREFP, a negative reference voltage VREFN, a positive input value INP and a negative input value INN, and digital data output terminals; resistors connected in series to sequentially level down the positive reference voltage VREFP and the negative reference voltage VREFN input through the data input/output terminals; comparators including a sampling block consisting of NMOS transistors and a sampling block consisting of PMOS transistors, for respectively comparing the positive reference voltage VREFP and the negative reference voltage VREFN leveled down by the resistors with the positive input value INP and the negative input value INN, wherein the sampling block consisting of NMOS transistors outputs the value of low bit comparators and the sampling block consisting of PMOS transistors outputs the value of high bit comparators; and an encoder for encoding the resultant value output from the comparators and outputting the digital converted value.

13 Claims, 8 Drawing Sheets

INN : a, INP : b, Vrefn : c, Vrefp : d, AGND : g

LOW-VOLTAGE ANALOG-TO-DIGITAL CONVERTER

BACKGROUND OF THE INVENTION

1. Field of the Invention

The present invention relates to an analog-to-digital (A/D) converter, and more particularly, to a low-voltage A/D converter which improves resolution by applying a sampling block at input terminal of a comparator to 0~Vdd period.

2. Discussion of the Related Art

Generally, industrial systems and controllers have trends to digital with the spread of CPUs having fast speed in an analog circuit at suitable cost. Most of industrial systems and controllers share digital mode with analog mode. In this respect, for signal transmission between digital mode and analog mode, analog-to-digital converter or digital-to-analog converter is required.

An analog-to-digital (A/D) converter is divided into an integrated mode and a comparative mode depending on a conversion mode. Since the comparative mode has a conversion speed faster than the integrated mode, it is mainly used in image processors and the like which require high conversion speed.

A background art A/D converter will be described with reference to the accompanying drawings.

FIG. 1 is a circuit diagram illustrating a background art flash A/D converter. FIG. 2 is a block diagram illustrating a background art comparator. FIG. 3 is a circuit diagram illustrating a background art NMOS transistor sampling block.

As shown in FIG. 1, a background art 4-bit flash A/D converter includes data input/output terminals consisting of a positive reference voltage input terminal 3 for inputting a positive reference voltage VREFP, a negative reference voltage input terminal 4 for inputting a negative reference voltage VREFN, a positive value input terminal 6 for inputting a positive input value INP, a negative value input terminal 5 for inputting a negative input value INN, and a digital data output terminal 7, resistors R1~R16 connected in series to sequentially level down the positive reference voltage and the negative reference voltage VREFN input through the data input/output terminals, comparators 2a~2o for respectively comparing the positive reference voltage VREFP and the negative reference voltage VREFN leveled down by the resistors R1~R16 at a certain unit with the positive input value INP and the negative input value INN, and an encoder 1 for encoding the resultant value output from the comparators 2a~2o and outputting the digital converted value.

In the 4-bit flash A/D converter of FIG. 1, the number of the comparators is $2^4-1$.

Each of the comparators includes a sampling block 8 for respectively sampling the positive reference voltage VREFP and the negative reference voltage VREFN leveled down by the resistors R1~R16 at a certain unit, the positive input value INP and the negative input value INN, an amplifier 9 for amplifying the sampled value, and a latch 10 for latching the positive value and the negative value output from the amplifier 9.

The sampling block 8 of the comparator will be described with reference to FIG. 3.

The sampling block 8 includes NMOS transistors NM1 and NM4 for switching the positive input value INP and the negative input value INN by an input operation clock PH1, NMOS transistors NM2 and NM3 for switching the positive reference voltage VREFP and the negative reference voltage VREFN by an operation clock PH2, capacitors C1 and C2 for storing and outputting sampling voltage values depending on selective turn-on/off of the NMOS transistors NM1, NM2, NM3 and NM4, and NMOS transistors NM5 and NM6 turned on by applying an operation clock PH3 at high to maintain output terminal of the sampling block 8 at AGND (ground) level and turned off by applying the operation clock PH3 at low after sampling operation is completed, for outputting sampling values.

The sampling block 8 performs sampling operation by externally applied operation clocks PH1, PH2 and PH3 as follows.

If the operation clock PH2 is applied at high under the state that the positive input value INP1 and the negative input value INN1 are maintained at AGND(ground) level by the operation clock PH3, the negative reference voltage VREFN and the positive reference voltage VREFP leveled down by the resistors R1~R16 are sampled as follows.

$$INN1=VREFN-AGND$$

$$INP1=VREFP-AGND$$

Subsequently, if the operation clock PH1 is applied at high and the operation clock PH2 is applied at low, the input voltages INN and INP are sampled.

$$INN1=INN-(VREFN-AGND)$$

$$INP1=INP-(VREFP-AGND)$$

INN1 and INP1 sampled by the sampling block 8 are amplified through the amplifier 9 and output as digital values through the latch 10.

The digital values sampled, amplified and latched in each of the comparators 2a~2o are encoded by the encoder 1 and finally output as 4 bits.

Since the background art flash A/D converter includes the sampling block consisting of only NMOS transistors, it has several problems.

Input range of the NMOS transistor is 0~(Vdd−$V_T$). In the current trend to low voltage of systems, it is impossible to use high input range by high $V_T$, so that resolution of the A/D converter is deteriorated.

SUMMARY OF THE INVENTION

Accordingly, the present invention is directed to a low-voltage A/D converter that substantially obviates one or more of the problems due to limitations and disadvantages of the related art.

An object of the present invention is to provide a low-voltage A/D converter which improves resolution by applying a sampling block at input terminal of a comparator to 0~Vdd period.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a low-voltage A/D converter according to the present invention includes: data input/output terminals consisting of input terminals for respectively inputting a positive reference voltage VREFP, a negative reference voltage VREFN, a positive input value INP and a negative input value INN, and digital data output terminals; resistors connected in series to sequentially level down the positive reference voltage VREFP and the negative reference voltage VREFN input through the data input/output terminals; comparators including a sampling block consisting of NMOS transistors and a sampling block consisting of PMOS transistors, for respectively comparing the positive reference voltage VREFP and the negative reference voltage VREFN leveled down by the resistors with the positive input value INP and the negative input value INN, wherein the sampling block consisting of NMOS transistors outputs the value of low bit and the sampling block consisted of PMOS transistors outputs the value of high bit comparators; and an encoder for encoding the resultant value output from the comparators and outputting the digital converted value.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
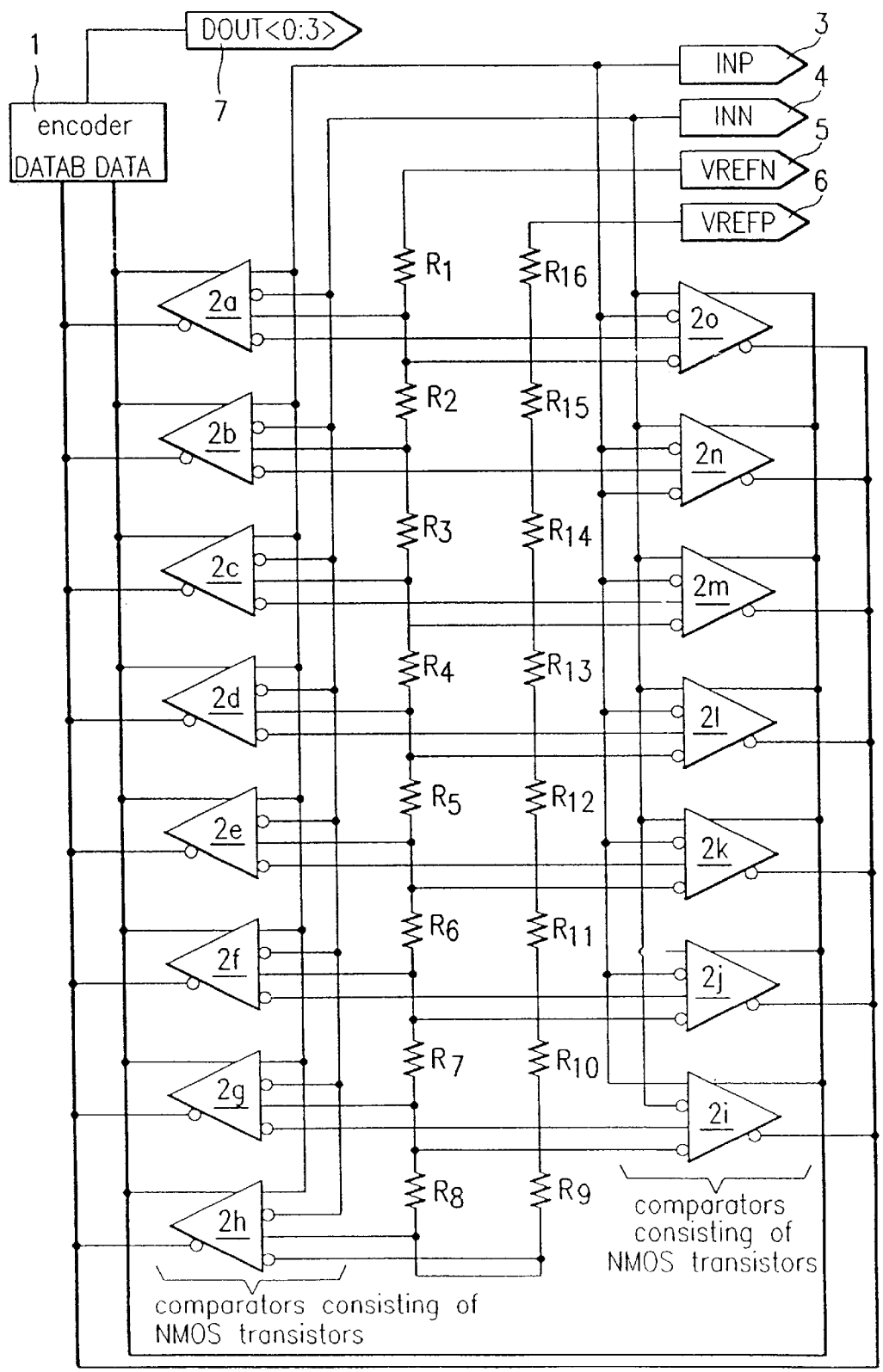
FIG. 1 is a circuit diagram illustrating a background art flash A/D converter.
Figure 2:
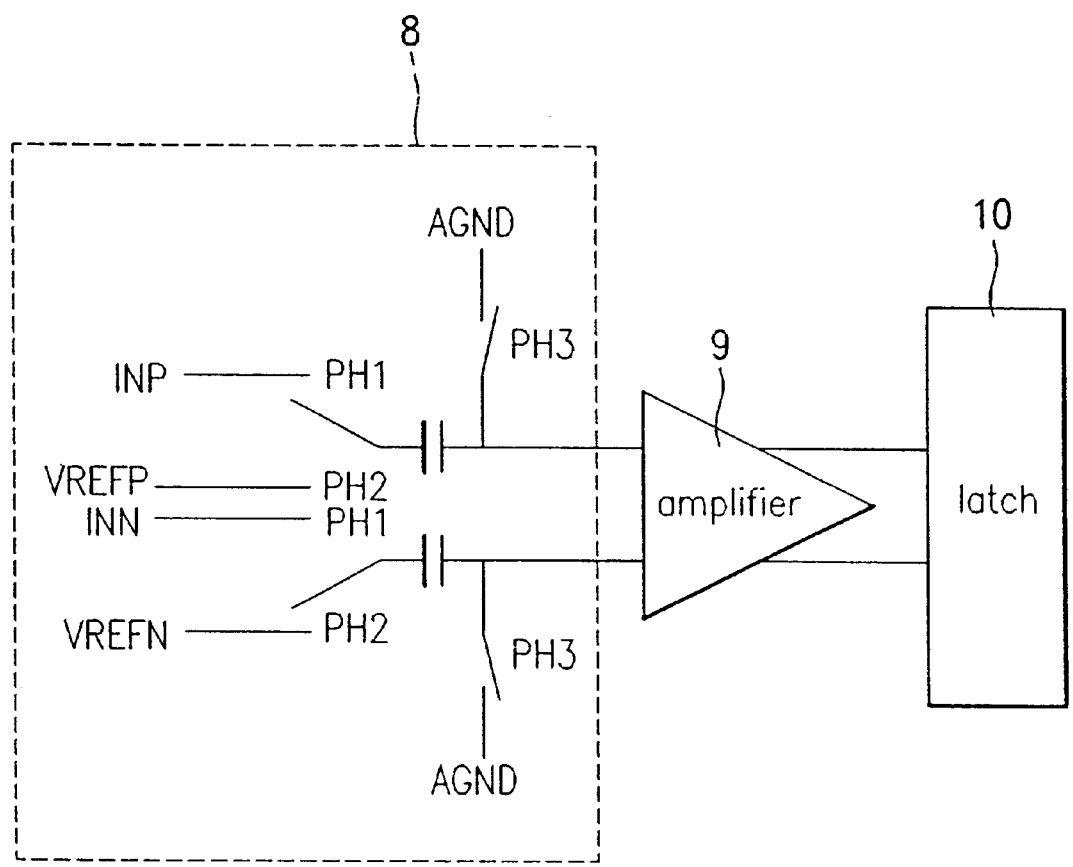
FIG. 2 is a block diagram illustrating a background art comparator.
Figure 3:
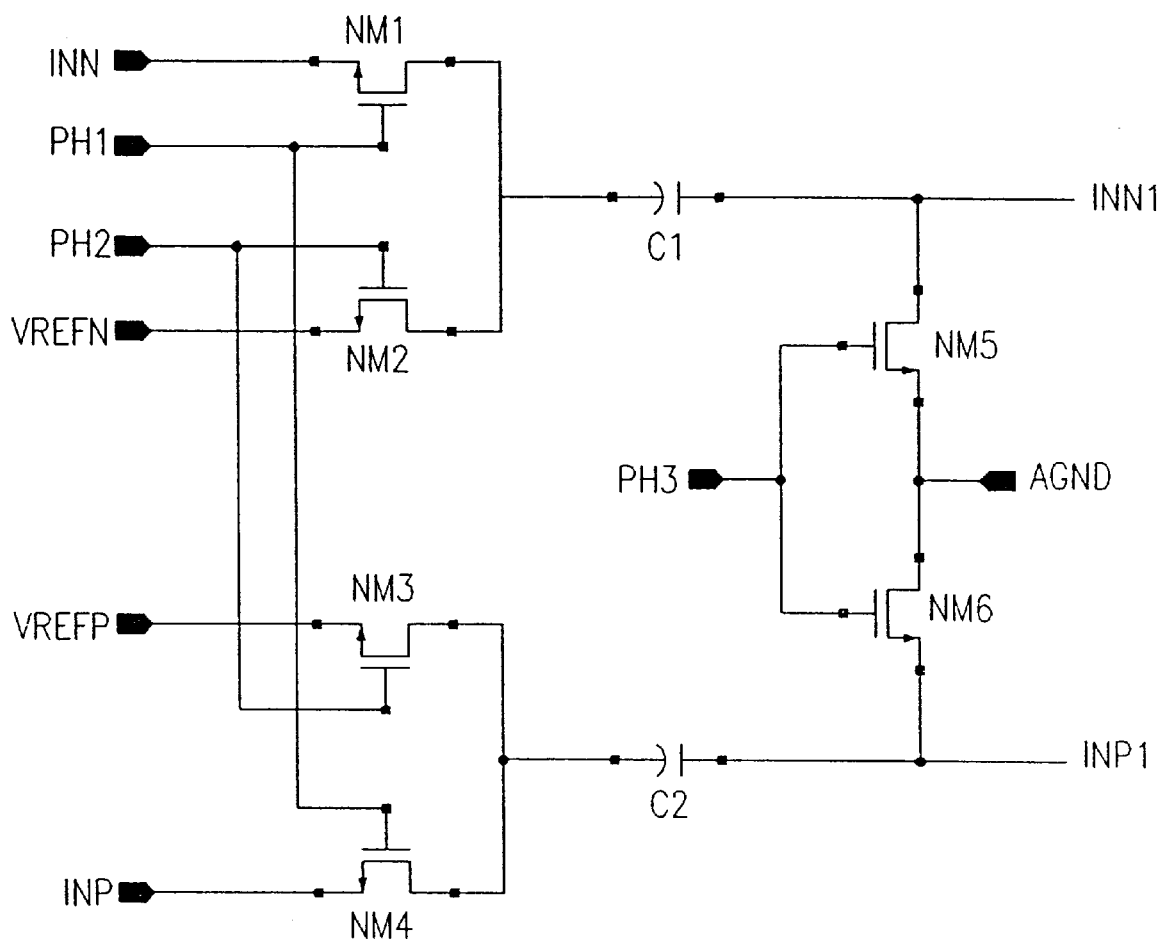
FIG. 3 is a circuit diagram illustrating a background art NMOS transistor sampling block.
Figure 4:
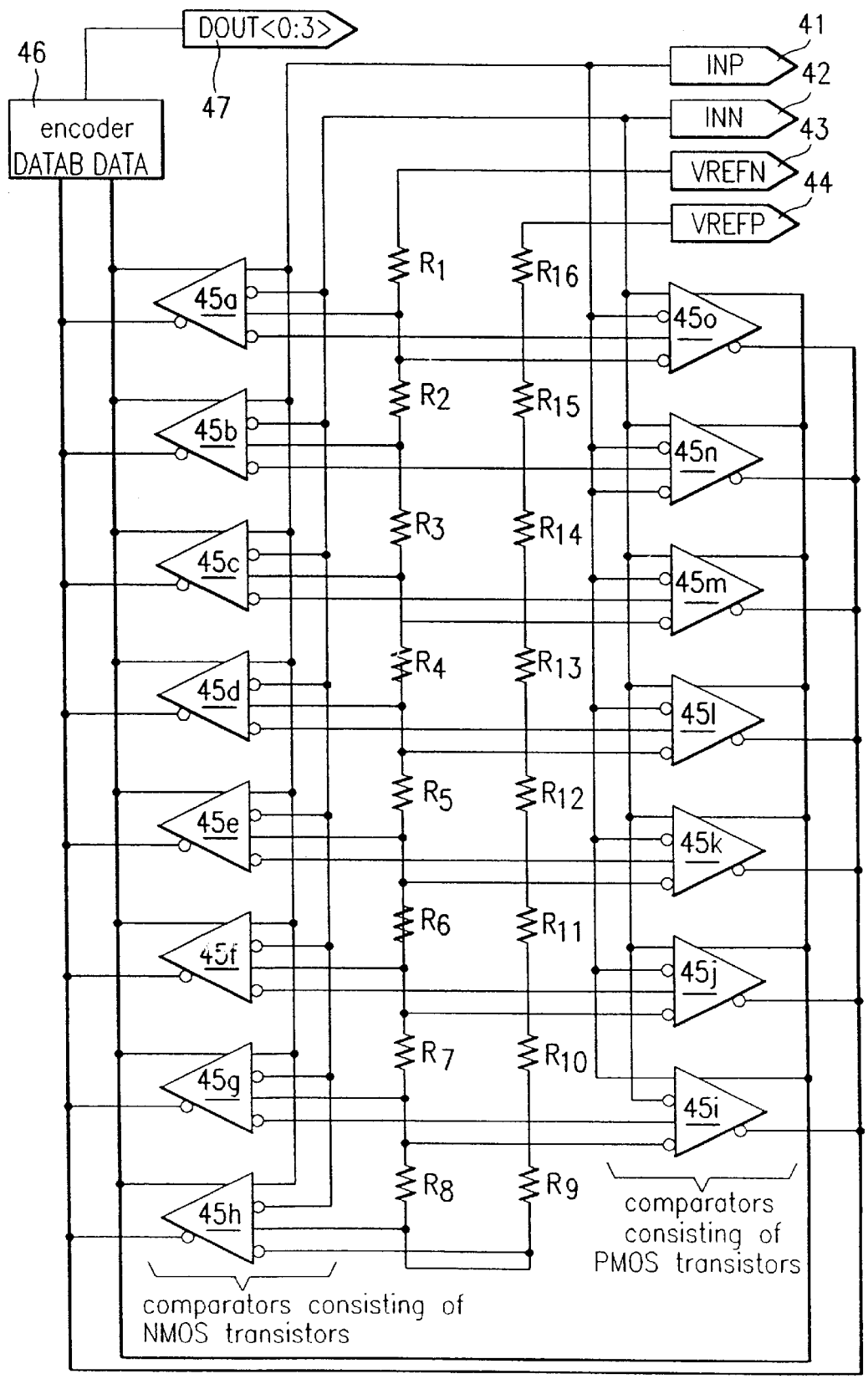
FIG. 4 is a circuit diagram illustrating a flash A/D converter according to the present invention.

Reference will now be made in detail to the preferred embodiments of the present invention, examples of which are illustrated in the accompanying drawings.

A flash A/D converter of the present invention is intended that from a comparator for outputting the value of the most significant bit to a comparator for outputting the value of the least significant bit, there are provided NMOS transistors and PMOS transistors.

In other words, the comparators for outputting the value of low bit consist of NMOS transistors while the comparators for outputting the value of high bit consist of PMOS transistors, so that conversion input range is within full period of 0~Vdd.

The flash A/D converter of the present invention includes data input/output terminals consisting of a positive reference voltage input terminal 44 for inputting a positive reference voltage VREFP, a negative reference voltage input terminal 43 for inputting a negative reference voltage VREFN, a positive value input terminal 41 for inputting a positive input value INP, a negative value input terminal 42 for inputting a negative input value INN, and a digital data output terminal 47, resistors R1~R16 connected in series to sequentially level down the positive reference voltage VREFP and the negative reference voltage VREFN input through the data input/output terminals, comparators 45a~45o for respectively comparing the positive reference voltage VREFP and the negative reference voltage VREFN leveled down by the resistors R1~R16 at a certain unit with the positive input value INP and the negative input value INN, and an encoder 46 for encoding the resultant value output from the comparators 45a~45o and outputting the digital converted value.

The comparators 45a~45h for outputting the value of the low bit include a sampling block consisting of NMOS transistors while the comparators 45i~45o for outputting the value of high bit include a sampling block consisting of PMOS transistors.

The number of the comparators is $2_N-1$ (where N is the number of convertibly output bits).

Figure 5:
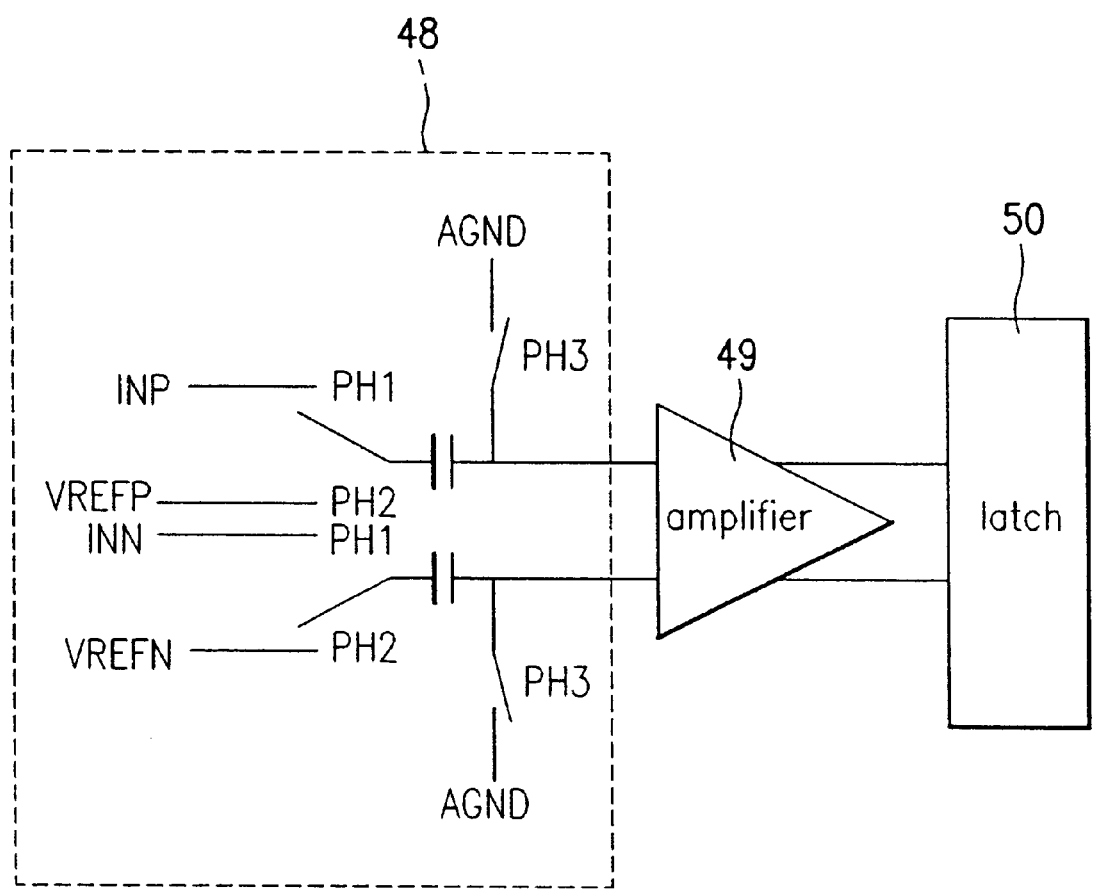
FIG. 5 is a block diagram illustrating a comparator according to the present invention.

As shown in FIG. 5, each of the comparators includes a sampling block 48 for respectively sampling the positive reference voltage VREFP and the negative reference voltage VREFN leveled down by the resistors R1~R16 at a certain unit, the positive input value INP, and the negative input value INN, an amplifier 49 for amplifying the sampled value, and a latch 50 for latching the positive value and the negative value output from the amplifier 49.

The sampling block 48 of the comparators will be described with reference to FIG. 6 and FIG. 7.

Figure 6:
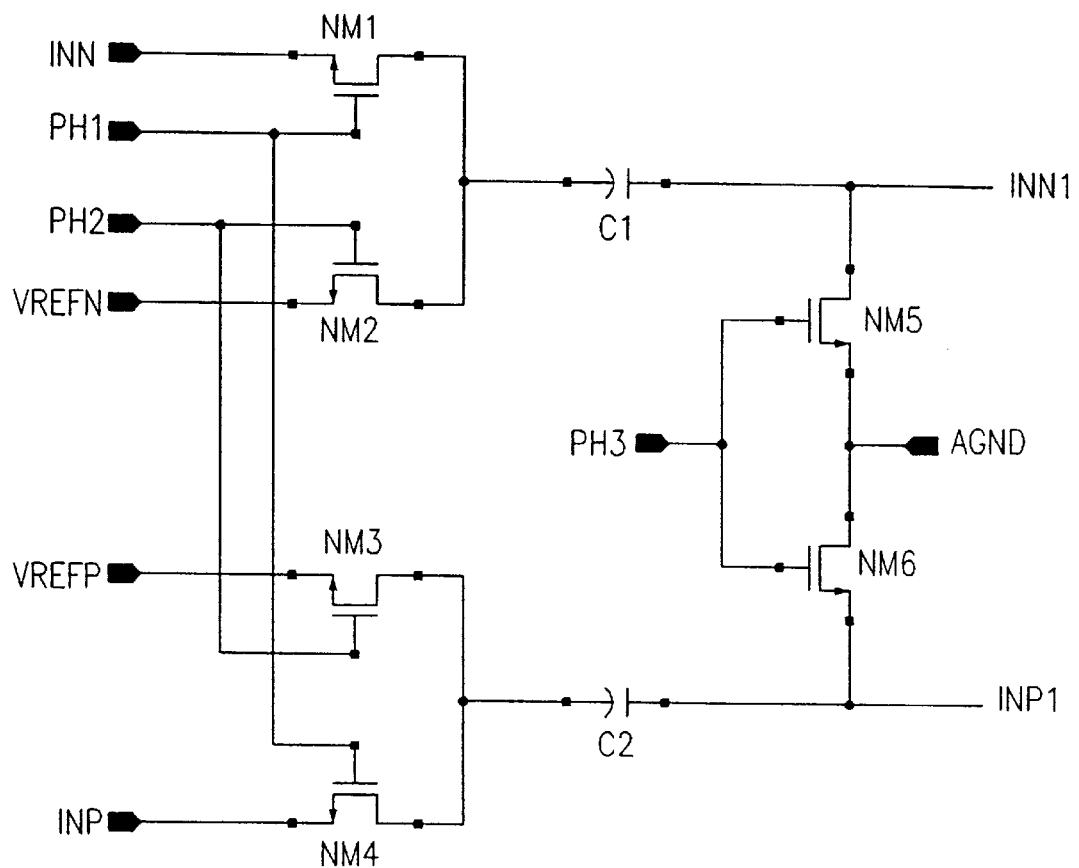
FIG. 6 is a circuit diagram illustrating an NMOS transistor sampling block according to the present invention.

As shown in FIG. 6, the sampling block 48 of the comparators 45a~45h includes NMOS transistors NM1 and NM4 for switching the positive input value INP and the negative input value INN by an input operation clock PH1, NMOS transistors NM2 and NM3 for switching the positive reference voltage VREFP and the negative reference voltage VREFN by an operation clock PH2, capacitors C1 and C2 for storing and outputting sampling voltage values depending on selective turn-on/off of the NMOS transistors NM1, NM2, NM3 and NM4, and NMOS transistors NM5 and NM6 turned on by applying an operation clock PH3 at high to maintain output terminal of the sampling block 48 at AGND level and turned off by applying the operation clock PH3 at low after sampling operation is completed, for outputting sampling values. Where, the operation clocks PH1, PH2 and PH3 are externally applied clocks for data sampling.

Figure 7:
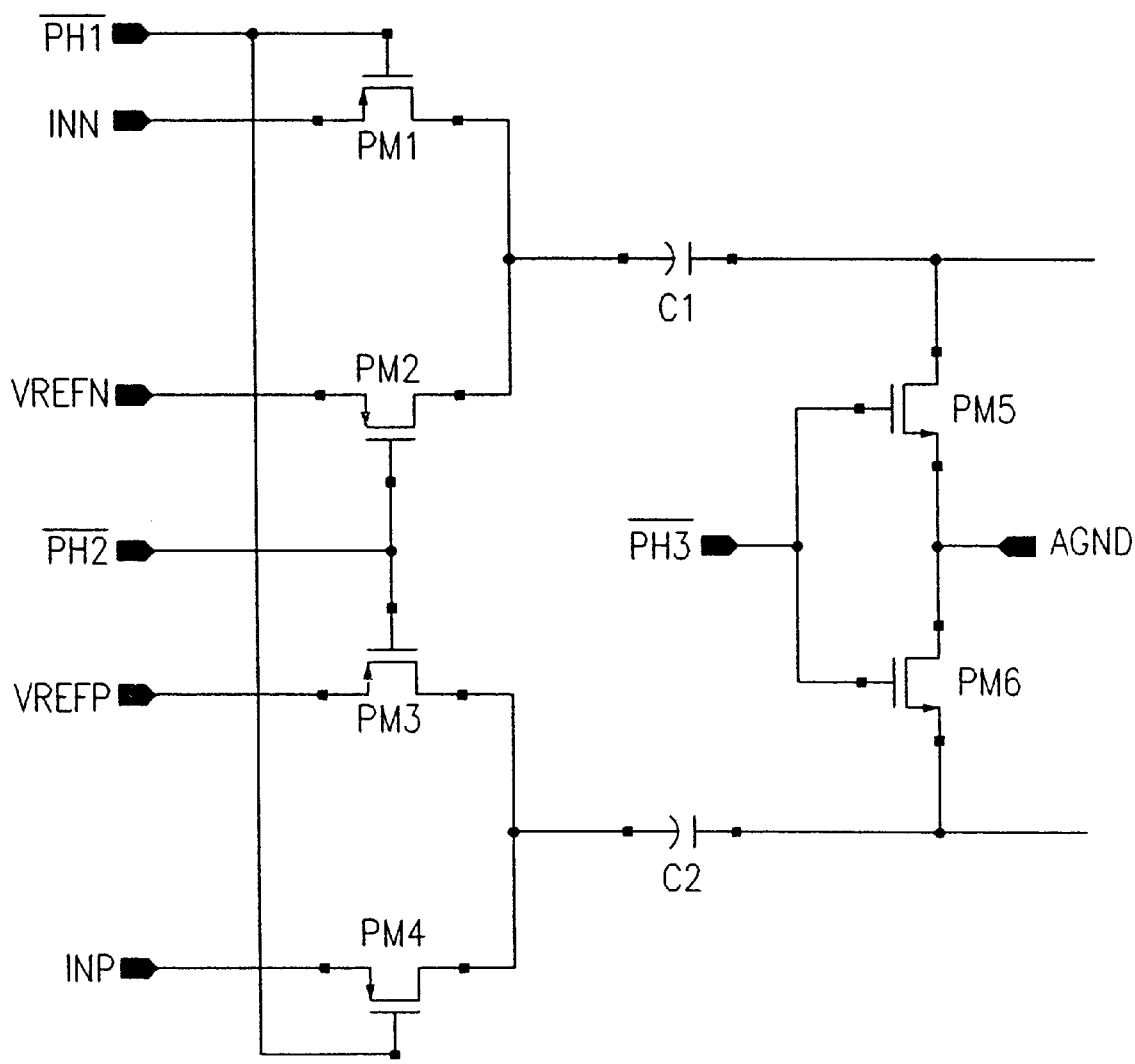
FIG. 7 is a circuit diagram illustrating a PMOS transistor sampling block according to the present invention.

As shown in FIG. 7, the sampling block 48 of the comparators 45i~45o includes PMOS transistors PM1 and PM4 for switching the positive input value INP and the negative input value INN by an input operation clock /PH1, PMOS transistors PM2 and PM3 for switching the positive reference voltage VREFP and the negative reference voltage VREFN by an operation clock /PH2, capacitors C1 and C2 for storing and outputting sampling voltage values depending on selective turn-on/off of the PMOS transistors PM1, PM2, PM3 and PM4, and PMOS transistors PM5 and PM6 turned on by applying an operation clock /PH3 at low to maintain output terminal of the sampling block 48 at AGND level and turned off by applying the operation clock /PH3 at high after sampling operation is completed, for outputting sampling values. Where, the operation clocks /PH1, /PH2 and /PH3 are externally applied clocks for data sampling.

In the flash A/D converter of the present invention, since the comparators 45a~45h having the sampling block 48 consisting of NMOS transistors are operated different from the comparators 45i~45o having the sampling block 48 consisting of PMOS transistors, the sampling operation thereof will be described, respectively.

First, the sampling operation of the comparators 45a~45h having the sampling block consisting of NMOS transistors will be described.

Figure 8:
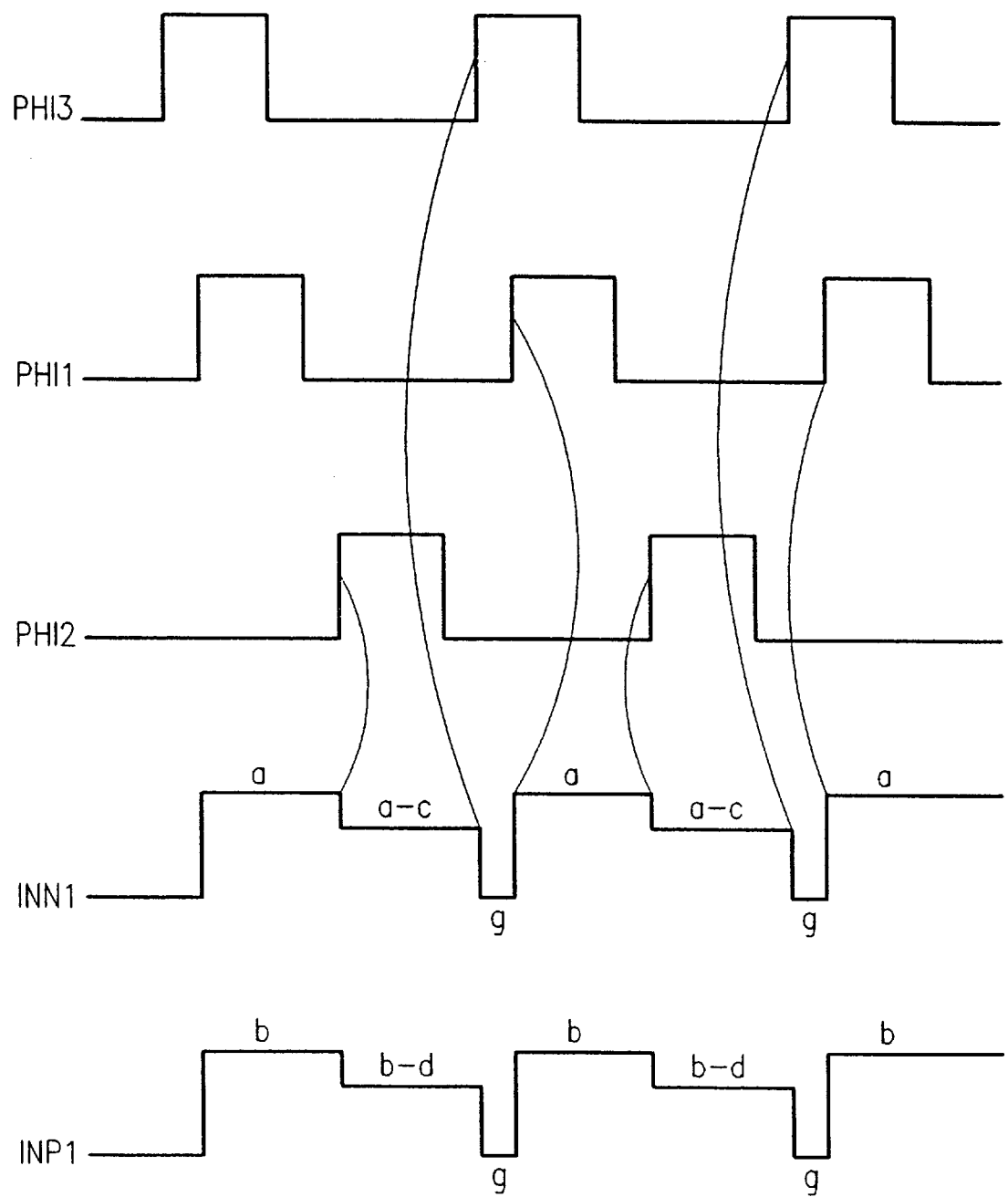
FIG. 8 shows waveforms illustrating the operation of a sampling block according to the present invention.

As shown in FIG. 8, if the operation clock PH2 is applied at high under the state that the positive input value INP1 and the negative input value INN1 are maintained at AGND (ground) level by the operation clock PH3, the NMOS transistors NM2 and NM3 are turned on so that the negative reference voltage VREFN and the positive reference voltage VREFP are sampled. The first negative and positive input values INN1 and INP1 can be expressed as follows.

INN1=VREFN−AGND

INP1=VREFP−AGND

Subsequently, if the operation clock PH1 is applied at high and the operation clock PH2 is applied at low, the input voltages INN and INP are sampled. The first negative and positive input values INN1 and INP1 can be expressed as follows.

INN1=INN−(VREFN−AGND)

INP1=INP−(VREFP−AGND)

The output values INN1 and INP1 of the sampling block 48 are amplified by the amplifier 49 and output as digital values of the comparators 45a~45h through the latch 50.

The sampling operation of the comparators 45i~45o having the sampling block consisting of PMOS transistors will be described.

If the operation clock /PH2 is applied at low (that is, PH2 is high) under the state that the positive input value INP1 and the negative input value INN1 are maintained at AGND (ground) level by the operation clock /PH3, the PMOS transistors PM2 and PM3 are turned on so that the negative reference voltage VREFN and the positive reference voltage VREFP are sampled. The negative and positive input values INN1 and INP1 can be expressed as follows.

INN1=VREFN−AGND

INP1=VREFP−AGND

Subsequently, if the operation clock /PH1 is applied at low (that is, PH1 is high) and the operation clock /PH2 is applied at high (that is, PH2 is low), the input voltages INN and INP are sampled. The negative and positive input values INN1 and INP1 can be expressed as follows.

INN1=INN−(VREFN−AGND)

INP1=INP−(VREFP−AGND)

The output values INN1 and INP1 of the sampling block 48 are amplified by the amplifier 49 and output as digital values of the comparators 45i~45o through the latch 50.

The output values of each of the comparators 45a~45h and 45i~45o are encoded by the encoder 46 and finally output as 4-bit A/D conversion value.

Input range of the PMOS transistor is VT~VDD and input range of the NMOS transistor is 0~(V$_T$−VDD). In FIG. 8, c and d are constant DC voltages, and a and b are input levels in the event of sampling.

In the flash A/D converter of the present invention, each transistor constituting the comparators 45a~45h and 45i~45o satisfies the following condition.

$$Id = \frac{1}{2}\mu_0 Cox \frac{W}{L}\left[(V_{GS} - V_T) - \frac{V_{DS}}{2}\right]V_{DS}(1 + \lambda V_{DS})$$

where, Id is the current value flowing to drain, $\mu_0$ is the average surface mobility of electron, Cox is the dielectric constant of a gate oxide film, L is the length of gate, W is the width of gate, $V_{GS}$ is the voltage applied to gate and source, $V_{DS}$ is the voltage applied to drain and source, and $\lambda$ is the channel length modulation factor value.

In the NMOS transistor which satisfies the above condition, if $V_{DS}=V_{GS}-V_T$, the NMOS transistor is turned on, and in the PMOS transistor, if $V_{SD}=V_{GS}-|V_T|$, the PMOS transistor is turned on.

It should be noted that $V_{GS}-V_T>0$ in case of the NMOS transistor while $V_{GS}-|V_T|>0$ in case of the PMOS transistor. Also, it should be noted $|V_{GS}|-|V_T|>0$.

Therefore, the transistors of the flash A/D converter according to the present invention have the following characteristic. That is, in case of the NMOS transistor, $V_G$ is $|V_T|\sim V_{DD}$ level and $V_D$ is $0\sim V_{DD}-|V_T|$ level. In case of the PMOS transistor, $V_G$ is $0\sim V_{DD}-|V_T|$ level and $V_D$ is $|V_T|\sim V_{DD}$ level.

The aforementioned flash A/D converter of the present invention has the following advantages.

The comparators for outputting the value of low bit include the sampling block consisting of PMOS transistors having input range of $V_T\sim V_{DD}$ and the comparators for outputting the value of high bit include the sampling block consisting of NMOS transistors having input range of $0\sim(V_{DD}-V_T)$. Therefore, since full period of $0\sim V_{DD}$ becomes input range of the flash A/D converter, low supply voltage and high resolution can be achieved.

It will be apparent to those skilled in the art that various modifications and variations can be made in the low-voltage A/D converter according to the present invention without departing from the spirit or scope of the invention. Thus, it is intended that the present invention covers the modifications and variations of the invention provided they come within the scope of the appended claims and their equivalents.

What is claimed is:

1. A low-voltage A/D converter comprising:

data input/output terminals consisting of input terminals for respectively inputting a positive reference voltage VREFP, a negative reference voltage VREFN, a positive input value INP and a negative input value INN, and digital data output terminals;

resistors connected in series to sequentially level down the positive reference voltage VREFP and the negative reference voltage VREFN input through the data input/output terminals;

comparators including a sampling block consisting of NMOS transistors and a sampling block consisting of PMOS transistors, for respectively comparing the positive reference voltage VREFP and the negative reference voltage VREFN leveled down by the resistors with the positive input value INP and the negative input value INN, wherein the sampling block consisting of NMOS transistors outputs the value of low bit comparators and the sampling block consisting of PMOS transistors outputs the value of high bit comparators; and an encoder for encoding the resultant value output from the comparators and outputting the digital converted value.

2. The low-voltage A/D converter as claimed in claim 1, wherein the number of the comparators is $2^N-1$ (where N is the number of convertibly output bits).

3. The low-voltage A/D converter as claimed in claim 1, wherein each of the comparators includes:

a sampling block for respectively sampling the positive reference voltage VREFP and the negative reference voltage VREFN leveled down by the resistors at a certain unit, the positive input value INP, and the negative input value INN;

an amplifier for amplifying the sampled value; and a latch for latching the positive value and the negative value output from the amplifier.

4. The low-voltage A/D converter as claimed in claim 1, wherein the sampling block consisting of NMOS transistors includes:

NMOS transistors NM1 and NM4 for switching the positive input value INP and the negative input value INN by an input operation clock PH1;

NMOS transistors NM2 and NM3 for switching the positive reference voltage VREFP and the negative reference voltage VREFN by an operation clock PH2;

capacitors C1 and C2 for storing and outputting sampling voltage values depending on selective turn-on/off of the NMOS transistors NM1, NM2, NM3 and NM4; and NMOS transistors NM5 and NM6 turned on by applying an operation clock PH3 at high to maintain output terminal of the sampling block at AGND level and turned off by applying the operation clock PH3 at low after sampling operation is completed, for outputting sampling values.

5. The low-voltage A/D converter as claimed in claim 4, wherein if the operation clock PH2 is applied at high under the state that the positive input value INP1 and the negative input value INN1 are maintained at AGND(ground) level by the operation clock PH3, the NMOS transistors NM2 and NM3 are turned on, so that the negative reference voltage VREFN and the positive reference voltage VREFP are sampled.

6. The low-voltage A/D converter as claimed in claim 5, wherein the negative input value INN1 has the value of VREFN−AGND and the positive input value INP1 has the value of VREFP−AGND when the negative reference voltage VREFN and the positive reference voltage VREFP are sampled.

7. The low-voltage A/D converter as claimed in claim 5, wherein if the operation clock PH1 is applied at high and the operation clock PH2 is applied at low after the negative reference voltage VREFN and the positive reference voltage VREFP are sampled, the input voltages INN and INP are sampled, so that the negative input value INN1 has the value of INN−(VREFN−AGND) and the positive input value INP1 has the value of INP−(VREFP−AGND).

8. The low-voltage A/D converter as claimed in claim 4, wherein $V_G$ of the NMOS transistor is $|V_T|{\sim}V_{DD}$ level and $V_D$ thereof is $0{\sim}V_{DD}-|V_T|$ level.

9. The low-voltage A/D converter as claimed in claim 1, wherein the sampling block consisting of PMOS transistors includes:

PMOS transistors PM1 and PM4 for switching the positive input value INP and the negative input value INN by an input operation clock /PH1;

PMOS transistors PM2 and PM3 for switching the positive reference voltage VREFP and the negative reference voltage VREFN by an operation clock /PH2;

capacitors C1 and C2 for storing and outputting sampling voltage values depending on selective turn-on/off of the PMOS transistors PM1, PM2, PM3 and PM4; and PMOS transistors PM5 and PM6 turned on by applying an operation clock /PH3 at low to maintain output terminal of the sampling block at AGND level and turned off by applying the operation clock /PH3 at high after sampling operation is completed, for outputting sampling values.

10. The low-voltage A/D converter as claimed in claim 9, wherein if the operation clock /PH2 is applied at low (that is, PH2 is high) under the state that the positive input value INP1 and the negative input value INN1 are maintained at AGND(ground) level by the operation clock /PH3, the PMOS transistors PM2 and PM3 are turned on, so that the negative reference voltage VREFN and the positive reference voltage VREFP are sampled.

11. The low-voltage A/D converter as claimed in claim 10, wherein the negative input value INN1 has the value of VREFN−AGND and the positive input value INP1 has the value of VREFP−AGND when the negative reference voltage VREFN and the positive reference voltage VREFP are sampled.

12. The low-voltage A/D converter as claimed in claim 10, wherein if the operation clock /PH1 is applied at low (that is, PH1 is high) and the operation clock /PH2 is applied at high (that is, PH2 is low) after the negative reference voltage VREFN and the positive reference voltage VREFP are sampled, the input voltages INN and INP are sampled, so that the negative input value INN1 has the value of INN−(VREFN−AGND) and the positive input value INP1 has the value of INP−(VREFP−AGND).

13. The low-voltage A/D converter as claimed in claim 9, wherein $V_G$ of the PMOS transistor is $0{\sim}V_{DD}-|V_T|$ level and $V_D$ thereof is $|V_T|{\sim}V_{DD}$ level.

* * * * *